United States Patent
Birk

(10) Patent No.: US 9,618,556 B2
(45) Date of Patent: Apr. 11, 2017

(54) MEMS DEVICE POSITIONING APPARATUS, TEST SYSTEM, AND TEST METHOD

(71) Applicant: FREESCALE SEMICONDUCTOR, INC., Austin, TX (US)

(72) Inventor: Thomas J. Birk, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/133,433

(22) Filed: Apr. 20, 2016

(65) Prior Publication Data

US 2016/0231369 A1    Aug. 11, 2016

Related U.S. Application Data

(62) Division of application No. 14/090,068, filed on Nov. 26, 2013, now Pat. No. 9,341,663.

(51) Int. Cl.
*G01R 31/00* (2006.01)
*B81C 99/00* (2010.01)

(52) U.S. Cl.
CPC .......... *G01R 31/003* (2013.01); *B81C 99/005* (2013.01)

(58) Field of Classification Search
CPC .............. G01R 31/003; G01R 31/2642; G01R 31/2817; G01R 31/2855; G01R 31/2849; G01R 31/31702
USPC .............. 324/756.01–757.05, 750.25, 750.3, 324/762.01
See application file for complete search history.

(56) References Cited

U.S. PATENT DOCUMENTS

| | | | |
|---|---|---|---|
| 6,522,546 B1 | 2/2003 | Boyer et al. | |
| 6,674,077 B1 * | 1/2004 | Joseph | B81C 99/005 250/306 |
| 6,708,132 B1 * | 3/2004 | Gutierrez | B81C 99/005 324/243 |
| 7,270,008 B1 | 9/2007 | DeAnna | |
| 7,498,800 B1 | 3/2009 | Whiteman | |
| 7,741,861 B2 | 6/2010 | Schaule et al. | |
| 8,212,578 B1 | 7/2012 | Gajda et al. | |
| 8,297,433 B2 | 10/2012 | Thiel et al. | |
| 2004/0207678 A1 * | 10/2004 | Silverbrook | B41J 2/04508 347/19 |
| 2005/0146708 A1 | 7/2005 | Shi et al. | |
| 2006/0155396 A1 | 7/2006 | Jeserer | |
| 2007/0097134 A1 | 5/2007 | Miles | |
| 2008/0262773 A1 * | 10/2008 | Howell | G01K 7/32 702/99 |

(Continued)

*Primary Examiner* — Patrick Assouad
*Assistant Examiner* — Demetrius Pretlow
(74) *Attorney, Agent, or Firm* — Charlene R. Jacobsen

(57) ABSTRACT

A positioning apparatus includes a support structure, a positioning structure, and a fixture for retaining MEMS devices. A shaft spans between the support structure and the positioning structure, and is configured to rotate about a first axis relative to the support structure in order to rotate the positioning structure and the fixture about the first axis. The positioning structure includes a pair of beams spaced apart by a third beam. Another shaft spans between the pair of beams and is configured to rotate about a second axis relative to the positioning structure in order to rotate the fixture about the second axis. Methodology entails installing the positioning apparatus into a chamber, orienting the fixture into various positions, and obtaining output signals from the MEMS devices to determine functionality of the MEMS devices.

20 Claims, 7 Drawing Sheets

(56) References Cited

U.S. PATENT DOCUMENTS

| | | | |
|---|---|---|---|
| 2010/0315113 A1 | 12/2010 | Thiel et al. | |
| 2011/0226544 A1* | 9/2011 | Viehmann | H04R 29/004 |
| | | | 181/198 |
| 2013/0175445 A1* | 7/2013 | Kim | H01J 37/08 |
| | | | 250/310 |
| 2013/0247682 A1* | 9/2013 | Oh | B81C 99/005 |
| | | | 73/826 |

* cited by examiner

MEMS DEVICE POSITIONING APPARATUS, TEST SYSTEM, AND TEST METHOD

TECHNICAL FIELD OF THE INVENTION

The present invention relates generally to microelectromechanical systems (MEMS) devices. More specifically, the present invention relates to a positioning apparatus, test system, and methodology for cost effectively testing a MEMS device in a plurality of positions.

BACKGROUND OF THE INVENTION

Microelectromechanical systems (MEMS) devices are used in a wide variety of products such as automobile airbag systems, control applications in automobiles, navigation, display systems, inkjet cartridges, and so forth. MEMS devices include, for example, pressure sensors, accelerometers, gyroscopes, microphones, digital mirror displays, micro fluidic devices, and so forth. Continuous progress is being made in MEMS device technology and fabrication efficiency. Indeed, productivity gains from advances in MEMS device technology and fabrication efficiency underlie the modern economy, making it possible to implement various MEMS devices in a wide variety of products.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, the Figures are not necessarily drawn to scale, and:

DETAILED DESCRIPTION

MEMS devices typically undergo comprehensive calibration and testing following fabrication. The degree of MEMS device testing depends upon the functionality of the MEMS device. However, an inherent temperature sensitivity of MEMS devices typically requires temperature testing to verify accuracy of the MEMS devices over a range of operational temperatures. Therefore, temperature testing with cold, ambient, and hot conditions is typically performed. Such a temperature test for MEMS devices is generally referred to as a tri-temperature (or simply tri-temp) thermal conditioning. Tri-temp thermal conditioning characterizes or tests the functionality of MEMS devices over a range of temperatures, for example, between −55° C. and +180° C. Tri-temp thermal conditioning can be used to determine resilience to temperature variation on the mechanical and electrical performance of the MEMS devices in order to ensure the accuracy and safety of the MEMS devices.

Unfortunately, the cost of MEMS device testing consumes an inordinate share of productions costs. Indeed, some estimates place the cost of MEMS device testing from between twenty to thirty percent based upon the device and its intended application. However, increasing production volumes and requirements for lower test costs continuously drives MEMS manufacturers to seek more efficient testing methods.

Embodiments entail a positioning apparatus, test system, and methodology for testing MEMS devices. In particular, embodiments enable MEMS devices to be tested in various positions and over a range of temperatures. The test system includes multiple axis control that minimizes operator involvement in a test process such as during thermal conditioning and/or calibration, while achieving improvements in position accuracy, MEMS device throughput, and reduced test time. Accordingly, MEMS devices can be trimmed and qualification readouts can be performed at significant cost savings.

Figure 1:
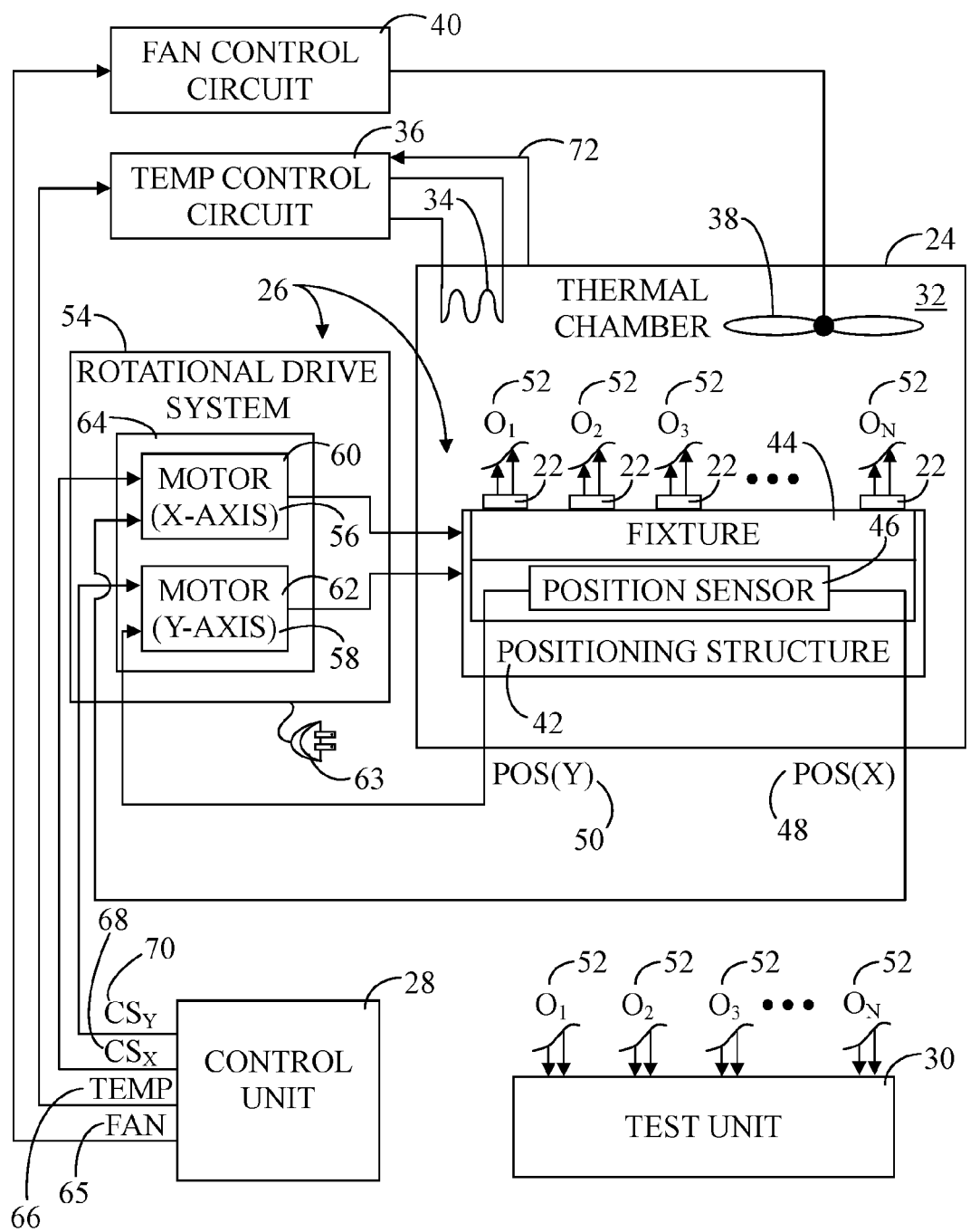
FIG. 1 shows a block diagram of a test system in accordance with an embodiment.

FIG. 1 shows a block diagram of a test system 20 in accordance with an embodiment. Test system 20 may be utilized to perform tri-temp thermal conditioning on one or more MEMS devices 22. MEMS devices 22 may be accelerometers, gyroscopes, magnetometers, or any of a variety of MEMS devices.

Test system 20 generally includes a chamber, referred to herein as a thermal chamber 24, a positioning apparatus 26, a control unit 28, and a test unit 30. Thermal chamber 24 is configured to hold a portion of positioning apparatus 26 within its interior space 32. Thermal chamber 24 includes one or more thermal elements 34 which may be controlled by a temperature control circuit 36 for cooling and/or heating interior space 32. Temperature control circuit 36 and thermal elements 34 may be adapted to provide a range of temperatures between, for example, −55° C. and +180° C. Thermal chamber 24 may further include a fan 38 which may be controlled by a fan control circuit 40 for circulating air within interior space 32. Thermal chamber 24 can be used to provide tri-temperature thermal conditioning and/or any other low-g application temperature testing.

In an embodiment, a portion of positioning apparatus 26 is configured to be installed into interior space 32 of thermal chamber 24. In particular, positioning apparatus 26 includes a positioning structure 42 and a fixture 44 which can be installed within thermal chamber 24. Positioning structure 42 is adapted to place fixture 44 in various positions. A position sensor 46 may be attached to fixture 44 to provide position measurement of fixture 44. Position sensor 46 may be an absolute position sensor or a relative one (displacement sensor). Position sensor 46 may provide output signals 48, 50 pertaining to the position of fixture 44 relative to two axes within a three-dimensional coordinate system. Of course, position sensor 46 may additionally provide output signals relative to all three axes within a three-dimensional coordinate system.

Fixture 44, sometimes referred to as a load board or carrier, is adapted to hold a plurality of MEMS devices 22 in a fixed and known position. Fixture 44 may be suitably wired to output pins (not shown) of MEMS devices 22 so as to route device output signals 52 from MEMS devices 22. In some embodiments, fixture 44 can retain a plurality of MEMS devices 22 for concurrent testing. Accordingly, testing may produce distinct output signals 52 for each MEMS device 22 under test. These distinct output signals 52 are represented by the terms $O_1$, $O_2$, $O_3$ to $O_N$, where "O" represents "output" and "N" represents the total number of MEMS devices 22 being tested.

Positioning system 26 further includes a rotational drive system 54 located external to thermal chamber 24. In accordance with an embodiment, rotational drive system 54 is configured to enable rotation of positioning structure 42 along with fixture 44 about an axis 56, labeled "X-AXIS" in FIG. 1. Rotational drive system 54 is additionally configured to enable rotation of fixture 44 about another axis 58, labeled "Y-AXIS" in FIG. 1. For exemplary purposes, rotational drive system 54 is illustrated herein as including a motor 60 for enabling rotation of positioning structure 42 about X-axis 56, and as including a motor 62 for enabling rotation of fixture 44 about Y-axis 58. Motors 60 and 62 may be embodied in a dual axis motor 64. Alternatively, motors 60 and 62 may be embodied as two distinct single axis motors. Motors 60 and 62 enable rotation of positioning structure 42 and fixture 44 via electric power. Accordingly, an electrical plug 63 is provided in FIG. 1 to represent the provision of electricity to electrically power motors 60 and 62.

Control unit 28 is adapted to control the operation of temperature control circuit 36, fan control circuit 40, and rotational drive system 54. Control unit 28 may be a conventional computing system including a processor, monitor, keyboard, mouse, as known to those skilled in the art. An operator using control unit 28 and executing program code at control unit 28 may send control signals to temperature control circuit 36, fan control circuit 40, and rotational drive system 54. These control signals may include for example, a fan on/off signal 65 (labeled FAN), a temperature setting signal 66 (labeled TEMP), an X-axis control signal 68 (labeled $CS_X$), and a Y-axis control signal 70 (labeled $CS_Y$).

In general, fan on/off signal 65 signals fan control circuit 40 to energize or de-energize fan 38. Temperature setting signal 66 signals temperature control circuit 36 to heat or cool interior space 32 of thermal chamber 24 to a particular temperature setting. The temperature of interior space 32 may be monitored via a temperature sensor located within interior space 32 that communicates a temperature signal 72 to temperature control circuit 36 and/or to control unit 28. X-axis control signal 68 signals motor 60 to rotate positioning structure 42, as well as fixture 44, to a predetermined position. Similarly, Y-axis control signal 70 signals motor 62 to rotate fixture 44 to a predetermined position. Exemplary positions in accordance with particular test methodology will be discussed in connection with FIGS. 9-11.

Test unit 30 is adapted to receive device output signals 52, $O_1$, $O_2$, $O_3$, ... $O_4$, from MEMS devices 22 during testing. Test unit 30 may be another conventional computing system including a processor, monitor, keyboard, mouse, and the like. Alternatively, test unit may be a special purpose computing unit. And in still other embodiments, test unit 30 and control unit 28 may be combined in a single computing system.

In general, test unit 30 determines the functionality of MEMS devices 22 in response to the received device output signals 52, as will be discussed in accordance with test methodology set forth in FIG. 12. The signal lines for device output signals 52 at MEMS devices 22 are discontinuous with the signal lines for device output signals 52 at test unit 30 for simplicity of illustration. Those skilled in the art will readily recognize that physical wiring may be implemented to provide device output signals 52 from MEMS devices 22 to test unit 30. Alternatively, device output signals 52 from MEMS devices 22 may be provided to test unit 30 via wireless communications.

Figure 2:
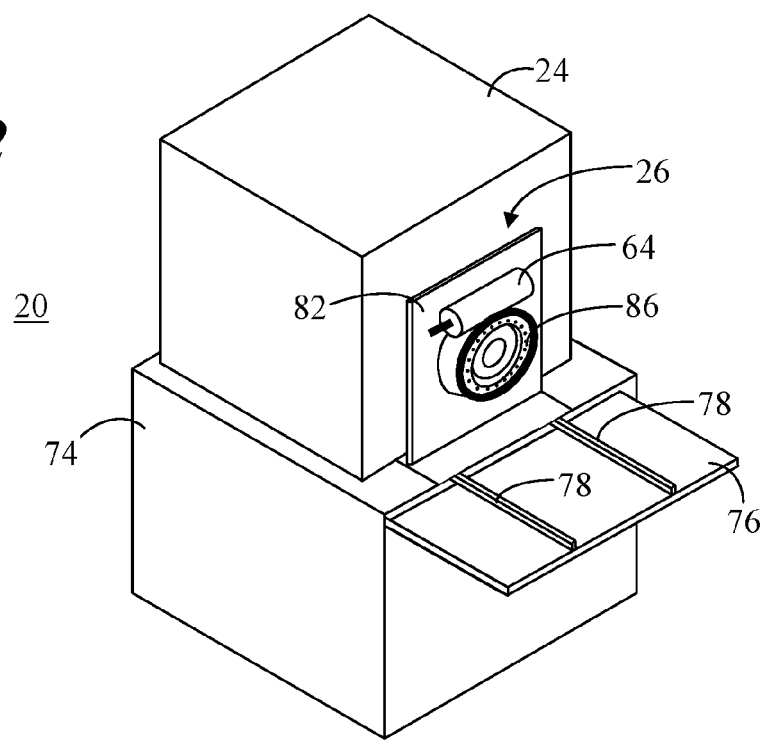
FIG. 2 shows a perspective view of an exemplary test system.
Figure 3:
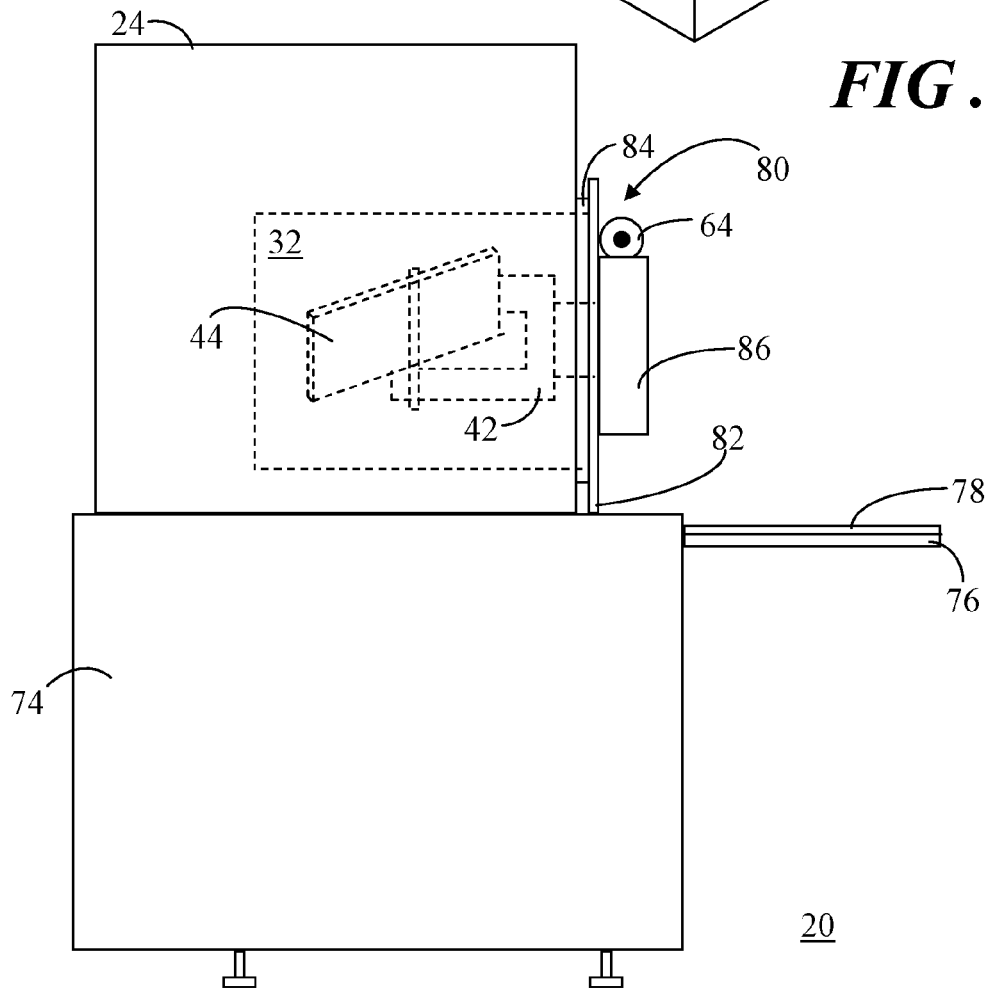
FIG. 3 shows a side view of the test system.

Referring to FIGS. 2-3 in connection with FIG. 1, FIG. 2 shows a perspective view of a test system 20 in an exemplary configuration, and FIG. 3 shows a side view of test system 20. Thermal chamber 24 may reside on a housing 74 in which some or all of the various components external to thermal chamber 24 may be located. For example, control unit 28, test unit 30, temperature control circuit 36, and/or fan control circuit 40 may be housed in housing 74. Test system 20 may further include a tray 76 upon which slide rails 78 are formed. Slide rails 78 may be used to facilitate the movement of positioning apparatus 26 into and out of interior space 32 of thermal chamber 24.

At least a portion of positioning apparatus 26 is configured to be placed in interior space 32 of thermal chamber 24. For example, positioning structure 42 and fixture 44 are shown in interior space 32, as represented in dashed line form in FIG. 3. However, positioning apparatus 26 additionally comprises a support structure 80, and support structure 80 includes among other features a face section 82 having a compliant seal 84. Accordingly, when face section 82 is attached to thermal chamber 24, it forms a sealable door of chamber 24 with positioning apparatus 26 and fixture 44 located within thermal chamber 24. Additionally, dual axis motor 64 may be mounted on face section 82 exterior to chamber 24. A gearbox 86 may house a gear mechanism (discussed below) for enabling rotation of positioning structure 26 as will be discussed in significantly greater detail below.

Figure 4:
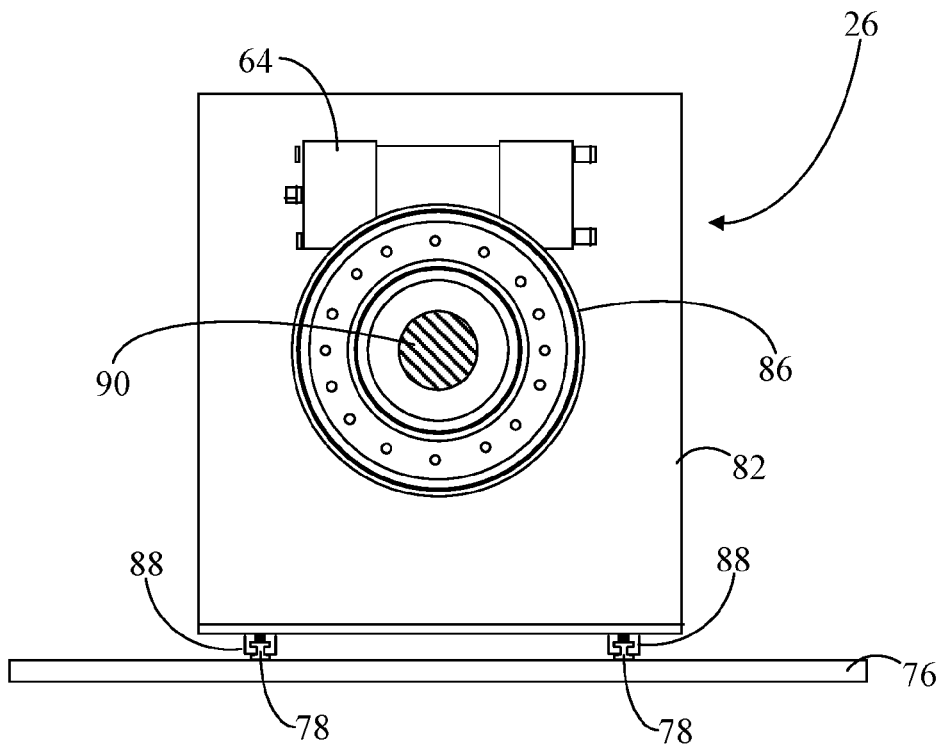
FIG. 4 shows a front view of a portion of the test system.

FIG. 4 shows a front view of a portion of the test system 20. In particular, FIG. 4 shows a front view of face section 82 of positioning apparatus 26 attached to thermal chamber 24. Positioning apparatus 26 includes receivers 88 that seat in slide rails 78 in order to readily slide positioning apparatus 26 into place with thermal chamber 24. A feedthrough port 90 is located in a center region of gearbox 86. Feedthrough port 90 enables the passage of a flexible shaft (discussed below), wiring, and the like into interior space 32 of thermal chamber 24. Feedthrough port 90 includes any suitable sealing structure (not shown) that largely prevents ingress or egress of air from interior space of thermal chamber 24. Feedthrough port 90 is represented by wide, downwardly and rightwardly directed hatching to distinguish it from the surrounding structures.

Figure 5:
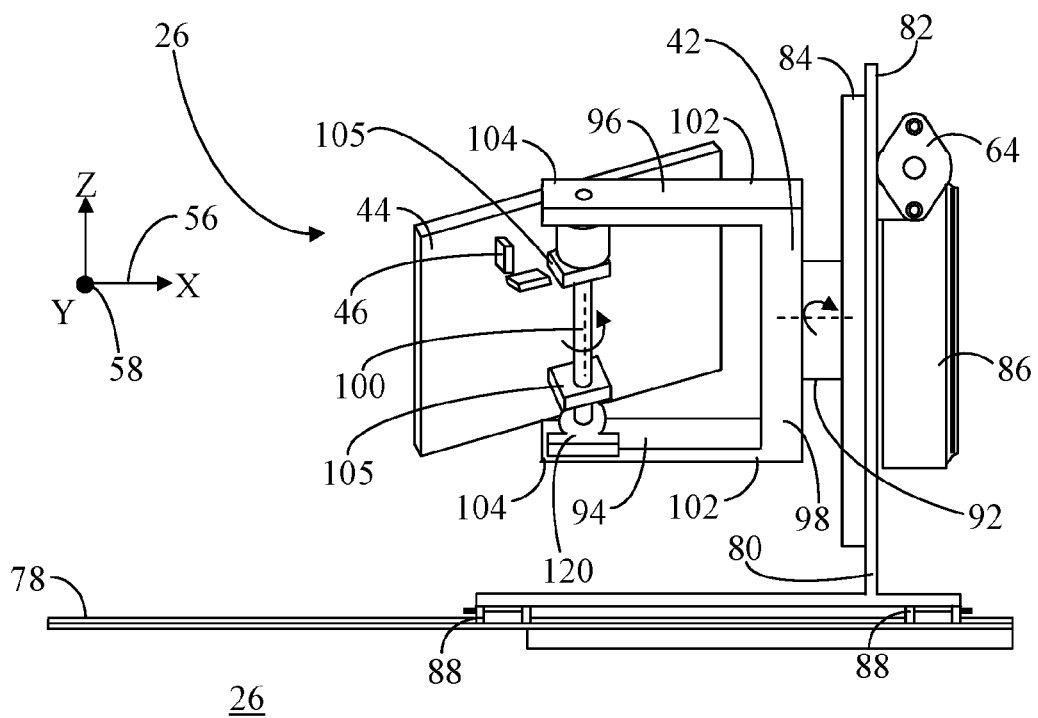
FIG. 5 shows a side view of a positioning apparatus of the test system.

FIG. 5 shows a side view of positioning apparatus 26 of test system 20. Positioning apparatus 26 includes support structure 80, positioning structure 42, and a shaft 92 spanning between and interconnected with each of support structure 80 and positioning structure 42. In an embodiment, shaft 92 is configured to rotate about a first axis relative to support structure 80. By way of example, shaft 92 is configured to rotate about X-axis 56 in order to rotate positioning structure 42 and fixture 44 about X-axis 56.

Positioning structure 42 includes supporting members in the form of first and second beams 94, 96 spaced apart from one another, and another beam 98 spanning between and interconnected with each of beams 94, 96. Another shaft 100 is spaced between and interconnects with each of first and second beams 94, 96. In an embodiment, each of beams 94, 96 has a first end 102 and a second end 104. Beam 98 is interconnected with first end 102 of each of beams 94, 96. Additionally, shaft 100 is interconnected with beams 94, 96 at second end 102. Fixture 44 is retained on shaft 100 via, for example, mounting blocks 105. Thus, fixture 44 is fixed to, or immovable relative to, shaft 100. Shaft 100 is configured to rotate about a second axis relative to positioning structure 42, in which the second axis is orthogonal to the first axis. By way of example, shaft 100 is configured to rotate about Y-axis 58. Due to their fixed connection, when shaft 100 rotates about Y-axis 58, fixture 44 also rotates, or pivots, about Y-axis 58. Position sensor 46 provides feedback of the actual position of fixture 44 relative to X-axis 56 and Y-axis 58 at a given instant.

In some embodiments, beams 94, 96, and 98 of positioning structure 42 may be formed from a ceramic material such as alumina. Such a ceramic material can provide temperature stability during tri-temp thermal conditioning since it does not flex or otherwise bend in response to temperature variations.

Figure 6:
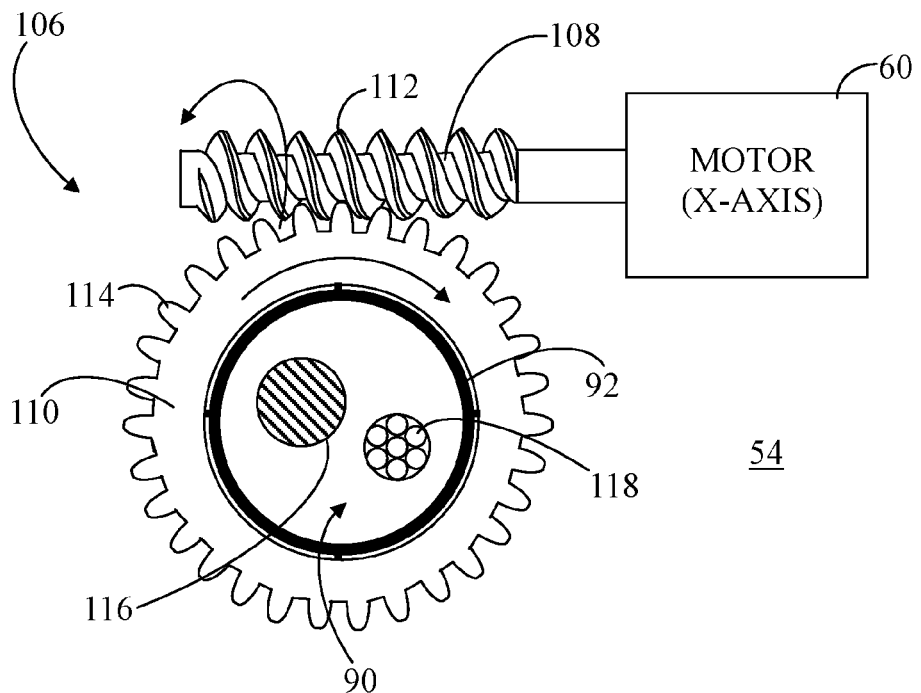
FIG. 6 shows a simplified side view of a portion of a rotational drive system implemented within the test system.

Now referring to FIG. 6 in connection with FIG. 5, FIG. 6 shows a simplified side view of a portion of a rotational drive system 54 implemented within test system 20 (FIG. 1). In some embodiments, rotational drive system 54 includes motor 60 and a worm drive 106 that cooperatively function to rotate, or pivot, positioning structure 42 about a first axis, e.g., X-axis 56. Worm drive 106 includes a worm 108 coupled with motor 60 and a worm gear 110 coupled with shaft 92. Worm drive 106 is a gear arrangement in which worm 108 (in the form of a screw) meshes with worm gear 110. Accordingly, worm 108 includes threads 112 that mesh with teeth 114 of worm gear 110.

In operation, worm 108 is driven to rotate by motor 60. The relationship of threads 112 with teeth 114 of worm gear 110 causes worm gear 110 to rotate when worm 108 rotates. Since worm gear 110 is coupled to shaft 92, shaft 92 rotates along with worm gear 110. Furthermore, since shaft 92 is interconnected with positioning structure 42, positioning structure 42 will also rotate, or pivot, to a desired position. In some embodiments, motor 60 may be a servomotor that includes a motor and a rotary encoder combination that forms a servomechanism. The encoder can provide position and speed feedback in order to enable rotational stability and relatively fast placement of positioning structure 42 into a stable position. Motor 60 may include a 4000 count/revolution encoder and worm drive 106 may have a gear ratio of 20:1, thereby achieving 80,000 counts/revolution (i.e., 0.0045 degrees/count). Although a worm drive configuration is described herein, it should be understood that other gear mechanisms may be implemented in alternative embodiments.

As further illustrated in FIG. 6, shaft 92 is generally hollow in order to form a passage, i.e., feedthrough port 90, through which a flexible shaft 116 as well as signal wires 118 may be routed. Signal wires 118 can form the physical connections between MEMS devices 22 (FIG. 1) installed in fixture 44 (FIG. 1) and test unit 30 (FIG. 1). As such, device output signals 52 (FIG. 1) can be communicated from MEMS devices 22 to test unit 30 during testing, such as during tri-temp thermal conditioning.

Figure 7:
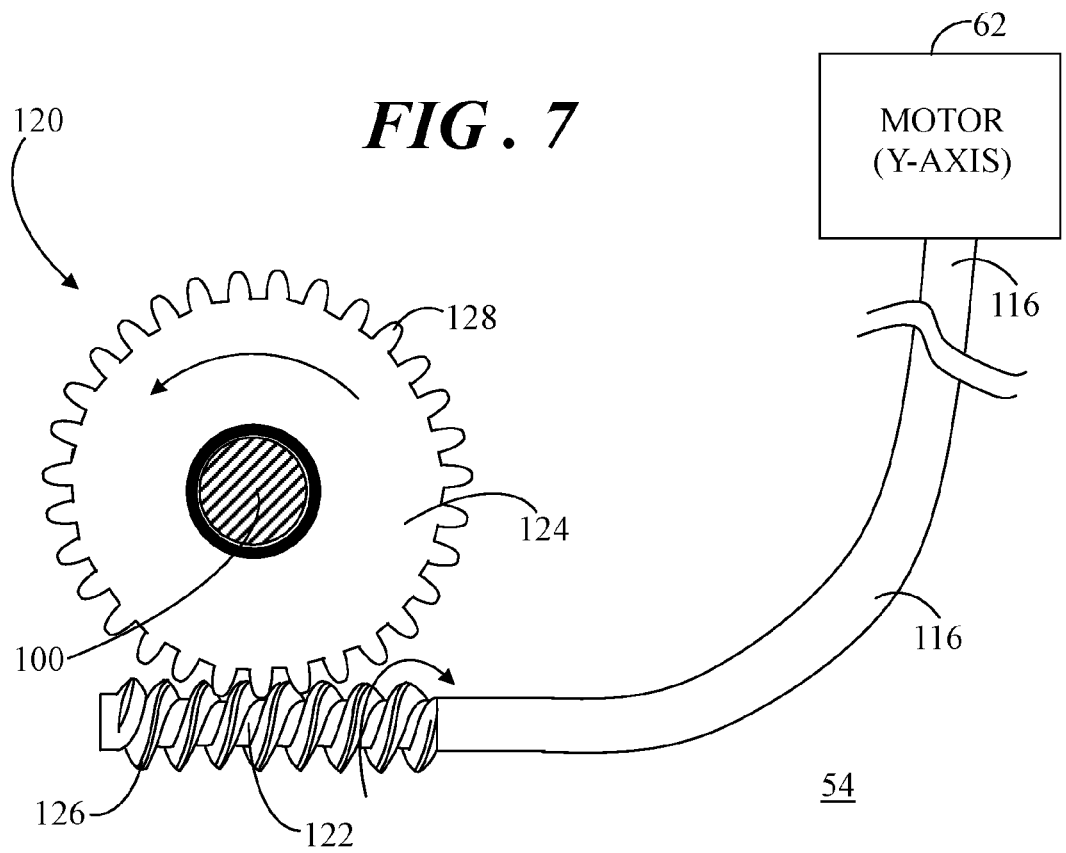
FIG. 7 shows a simplified side view of another portion of the rotational drive system implemented within the test system.

Now referring to FIG. 7 in connection with FIG. 5, FIG. 7 FIG. 7 shows a simplified side view of another portion of rotational drive system 54 implemented within the test system 20 (FIG. 1). In some embodiments, rotational drive system 54 includes motor 62, a transfer shaft, also referred to herein as flexible shaft 116, and another worm drive 120 that cooperatively function to rotate, or pivot, fixture 44 relative to positioning structure 42. Worm drive 120 includes a worm 122 coupled with flexible shaft 116, which in turn is coupled with motor 62. Worm drive 120 further includes a worm gear 124 coupled with shaft 100. Worm drive 120 is a gear arrangement in which worm 122 (in the form of a screw) meshes with worm gear 124. Accordingly, worm 122 includes threads 126 that mesh with teeth 128 of worm gear 124.

In an embodiment, worm drive 120 is located within interior space 32 (FIG. 1). As such, worm drive 120 is simplistically illustrated in FIG. 5 coupled with shaft 100. As mentioned previously, motor 62 is located outside of chamber 24 (FIG. 1) and flexible shaft 116 is directed through feedthrough port 90 (FIG. 6). Thus in FIG. 7, flexible shaft 116 is shown in discontinuous form to represent its passage from motor 62, through feedthrough port 90, and coupling with worm 122.

In operation, flexible shaft 116 is driven to rotate by motor 62. Due to their interconnection, worm 122 rotates along with flexible shaft 116. The relationship of threads 126 of worm 122 with teeth 128 of worm gear 124 causes worm gear 124 to rotate when worm 122 rotates. Since worm gear 124 is coupled to shaft 100, shaft 100 also rotates along with worm gear 124. Furthermore, since shaft 100 is interconnected with fixture 44, fixture 44 will also rotate, or pivot, to a desired position. In some embodiments, motor 62 may also be a servomotor that includes a motor and a rotary encoder combination that forms a servomechanism. Motor 62 may be configured to achieved, for example, less than +/−0.1 degree of rotational accuracy. Again, although a worm drive configuration is described herein, it should be understood that other gear mechanisms may be implemented in alternative embodiments.

Figure 8:
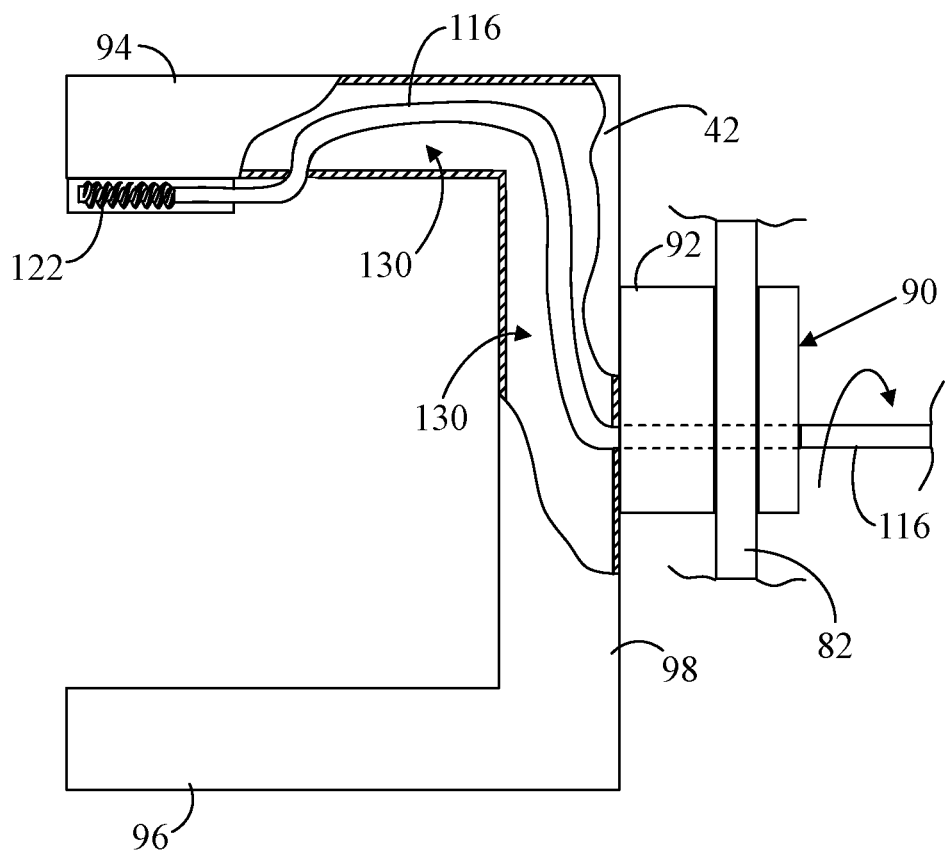
FIG. 8 shows a cut away partial top view of a positioning structure of the test system.

FIG. 8 shows a cut away partial top view of positioning structure 42 of test system 20 (FIG. 1). In some embodiments, some or all of beams 94, 96, and 98 of positioning structure 42 includes a hollow region 130 in which flexible shaft 116 may be located. Flexible shaft 116 is capable of transmitting rotary motion between two objects, and in particular, between motor 62 (FIG. 7) and worm 122, which are not fixed relative to one another. Flexible shaft 116 may be formed from a rotating wire rope or coil which is flexible, but has some torsional stiffness. As shown in the cut away view of FIG. 8, beams 94 and 98 are shown as having hollow region 130. Accordingly, flexible shaft 116 may be passed through feedthrough port 90, shaft 92, beam 98, and beam 94 to interconnect with worm 122.

Subsequent illustrations will present various positions in which fixture 44 (FIG. 5) may be oriented during MEMS device testing in accordance with testing methodology. The testing may entail tri-temp thermal conditioning or any other suitable test in which device output signals 52 (FIG. 1) may be collected from MEMS devices 22 (FIG. 1) when MEMS devices 22 are placed into the various positions.

Figure 9:
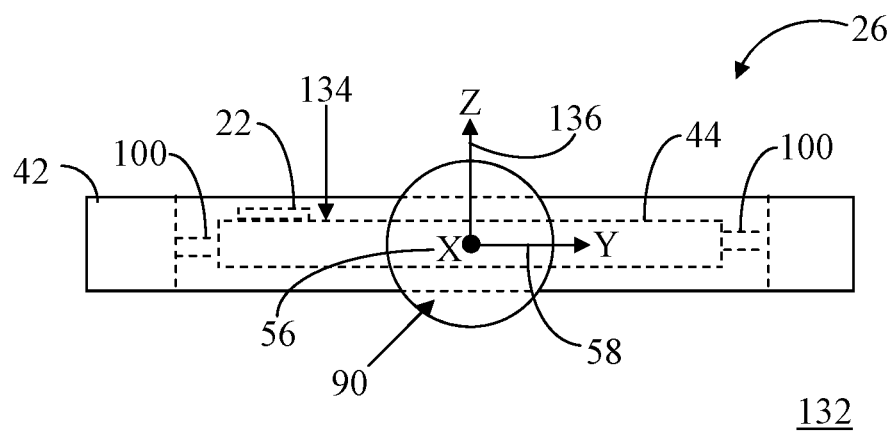
FIG. 9 shows a simplified partial front view exemplifying the positioning apparatus of the test system placed in a first position.

FIG. 9 shows a simplified partial front view exemplifying positioning structure 42 and fixture 44 of positioning apparatus 26 of test system 20 (FIG. 1) placed in a first position 132. More particularly, FIG. 9 is presented as looking inwardly toward thermal chamber 24 (FIG. 1) from feedthrough port 90. First position 132 may entail an orientation in which positioning structure 42 and fixture 44 are oriented such that a planar surface 134 of fixture 44 is perpendicular to, for example, a Z-axis 136, within a three-dimensional coordinate system. As such, planar surface 134 of fixture 44 extends in two directions, i.e., parallel to X-axis 56 and parallel to Y-axis 58. Z-axis 136 is directed up-and-down in FIG. 9. Whereas, Y-axis 58 extends right-to-left in FIG. 9 and X-axis 56 extends inwardly into the page.

Precise position control of positioning structure 42 and fixture 44 may be accomplished via motors 60 and 62 (FIG. 1), and feedback of first position 132 may be detected via position sensor 46 (FIG. 1). For illustrative purposes, a single MEMS device 22 is shown in dashed line format installed on planar surface 134 of fixture 44. However, it should be understood that a plurality of MEMS devices 22 may be loaded into fixture 44 as discussed in connection with FIG. 1.

Figure 10:
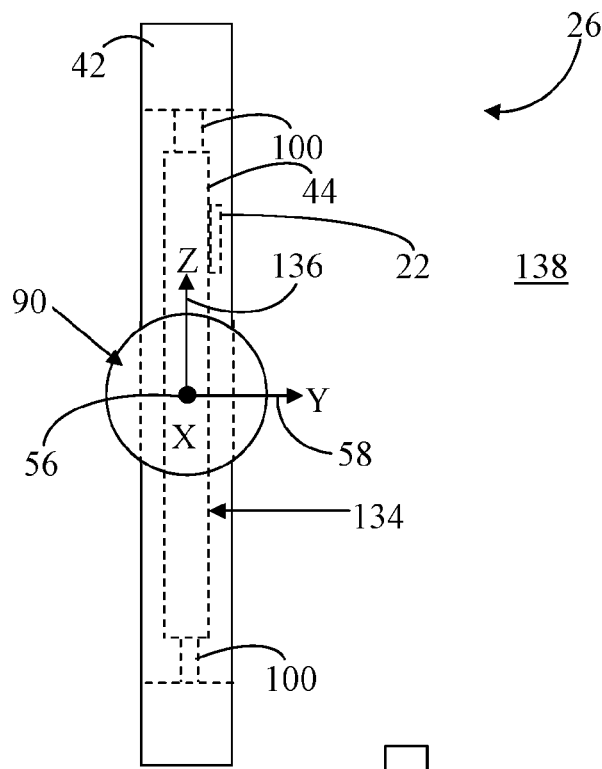
FIG. 10 shows a simplified partial front view exemplifying the positioning apparatus of the test system placed in a second position.

FIG. 10 shows a simplified partial front view exemplifying positioning structure 42 and fixture 44 of positioning apparatus 26 of test system 20 (FIG. 1) placed in a second position 138. Like FIG. 9, FIG. 10 is presented as looking inwardly toward thermal chamber 24 (FIG. 1) from feedthrough port 90. Second position 138 may entail an orientation in which positioning structure 42 and fixture 44 are oriented such that planar surface 134 of fixture 44 is perpendicular to, for example, a Y-axis 58, within a three-dimensional coordinate system. As such, planar surface 134 of fixture 44 extends in two directions, i.e., parallel to X-axis 56 and parallel to Z-axis 136. Z-axis 136 is directed up-and-down in FIG. 10. Y-axis 58 extends right-to-left in FIG. 10, and X-axis 56 extends inwardly into the page.

Precise position control of positioning structure 42 and fixture 44 may be accomplished via motors 60 and 62 (FIG. 1), and feedback of second position 138 may be detected via position sensor 46 (FIG. 1). More particularly, motor 60 (FIG. 1) may be actuated to rotate shaft 92 (FIG. 5) and thereby rotate, or pivot, positioning structure 42 and fixture 44. Again, a single MEMS device 22 is shown in dashed line format installed on planar surface 134 of fixture 44 for illustrative purposes. However, in actual practice, a plurality of MEMS devices 22 may be loaded into fixture 44.

Figure 11:
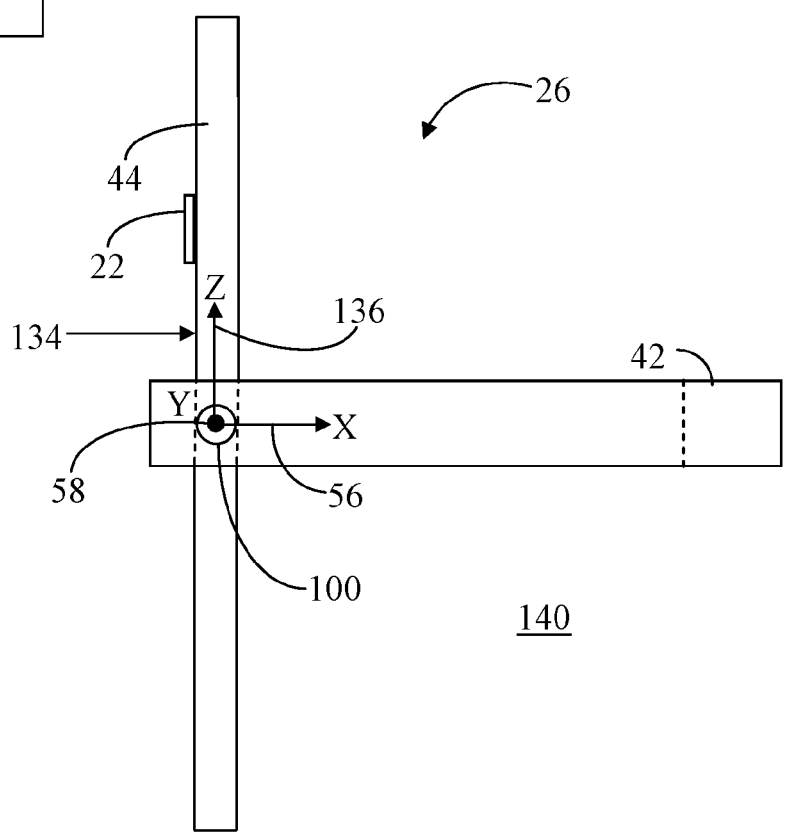
FIG. 11 shows a simplified partial side view exemplifying the positioning apparatus of the test system placed in a third position.

FIG. 11 shows a simplified partial side view exemplifying fixture 44 of positioning apparatus 26 of test system 20 (FIG. 1) placed in a third position 140. Third position 140 may entail an orientation in which positioning structure 42 and fixture 44 are oriented such that planar surface 134 of fixture 44 is perpendicular to, for example, a X-axis 56, within a three-dimensional coordinate system. As such, planar surface 134 of fixture 44 extends in two directions, i.e., parallel to Y-axis 58 and parallel to Z-axis 136. Z-axis 136 is directed up-and-down in FIG. 11. X-axis 56 extends right-to-left in FIG. 11, and Y-axis 58 extends inwardly into the page.

Precise position control of positioning structure 42 and fixture 44 may be accomplished via motors 60 and 62 (FIG. 1), and feedback of third position 140 may be detected via position sensor 46 (FIG. 1). More particularly, motor 62 (FIG. 1) may be actuated to rotate shaft 100 (FIG. 5) and thereby rotate, or pivot, fixture 44 relative to positioning structure 42. A single MEMS device 22 is shown in solid line format installed on planar surface 134 of fixture 44 for illustrative purposes. However, a plurality of MEMS devices 22 may be loaded into fixture 44 in actual practice.

Figure 12:
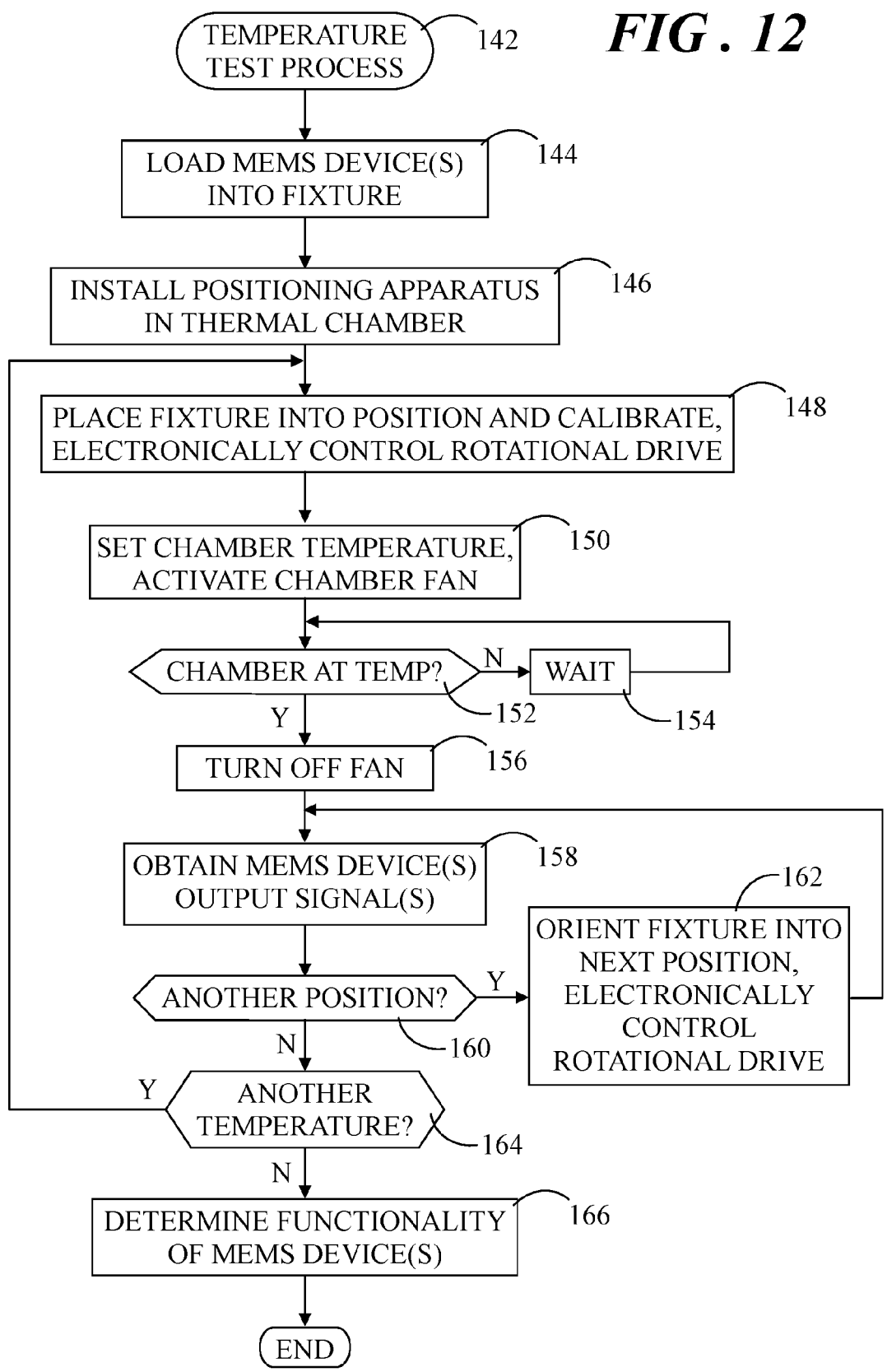
FIG. 12 shows a flowchart of a temperature test process performed using the test system in accordance with another embodiment.

Fixture 44 may be oriented into first, second, and third positions 132, 138, 140 shown in FIGS. 9-11 during thermal testing in accordance with methodology presented in connection with FIG. 12. Positions 132, 138, 140 are orthogonal to one another for simplicity of analysis. In other embodiments, thermal testing may be performed with fixture 44 oriented into different positions that may be orthogonal relative to one another and/or may be compound angles. Positioning apparatus 26 enables testing of MEMS devices 22 in a plurality of positions in accordance with a variety of test methodologies. Furthermore, positioning apparatus 26 enables testing of MEMS devices 22 in a plurality of positions with minimal operator handling.

FIG. 12 shows a flowchart of a temperature test process 142 performed using test system 20 in accordance with another embodiment. Temperature test process 142 may be executed in order to test MEMS devices 22 in a range of positions and over a range of temperatures. By way of example, temperature test process 142 may be executed to perform tri-temp thermal conditioning in order to characterize, or test, the functionality of MEMS devices 22 over a range of temperatures, typically between −55° C. and +180° C. Temperature test process 142 may be embodied as executable code executed at control unit 28 (FIG. 1) by a test operator.

Temperature test process 142 begins with a task 144. At task 144, MEMS devices 22 (FIG. 1) are loaded into fixture 44. Loading task 144 may be performed utilizing pick and place techniques, or any suitable manual or automated process and equipment.

Following task 144, a task 146 is performed. At task 146, positioning apparatus 26, and more particularly, positioning structure 42 with the attached fixture 44 are installed in thermal chamber 24. For example, receivers 88 (FIG. 5) of positioning apparatus 26 may be slid along slide rails 78 (FIG. 2) until face section (FIG. 3) engages with thermal chamber 24 (FIG. 3). This movement may be performed manually by an operator. However, some embodiments may entail a motor driven closure system (not shown).

Next, at a task 148, control unit 28 (FIG. 1) may be used by an operator to place fixture 44 into a desired position, for example, first position 132 (FIG. 9). By way of example, control software may be executed at control unit 28 that provides X-axis and Y-axis control signals 68, 70 (FIG. 1) to motors 60 and 62 to actuate respective worm drives 106, 120 (FIGS. 6 and 7) in order to electronically control the position of positioning structure 42 and fixture 44. The actual position of fixture 44 may be sensed by position sensor 46 and provided as feedback to control unit 28 and/or rotational drive system 54.

Following task 148, a task 150 may be performed. At task 150, the temperature of thermal chamber 24 is set in accordance with a particular test protocol and fan 38 (FIG. 1) is activated. Again, by way of example, the control software executed at control unit 28 may provide temperature setting signal 66 (FIG. 1) to temperature control circuit 36 (FIG. 1) to set the temperature of thermal chamber 24. The control software may also provide fan on/off signal 65 (FIG. 1) to fan control circuit 40 (FIG. 1) so as to activate, i.e., turn on, fan 38.

Temperature test process 142 continues with a query task 152. At query task 152, a determination is made as to whether thermal chamber 24 had reached the desired temperature setting. By way of example, temperature signal 72 (FIG. 1) may be provided from thermal chamber 24 to temperature control circuit 36. This temperature signal 72 may also be provided to control unit 28. When a determination is made at query task 152, that the temperature of interior space 32 (FIG. 1) of thermal chamber 24 has not yet reached the desired temperature setting, process 142 continues with a task 154.

At task 154, process 142 is placed in a wait state for a predetermined period of time. Eventually, program control loops back to query task 152 to again check temperature signal 72. When query task 152 eventually determines that the temperature of interior space 32 has stabilized at the desired temperature setting in accordance with temperature setting signal 66, temperature test process 142 continues with a task 156.

At task 156, fan 38 is deactivated. An operational fan 38 might impose mechanical, vibratory-type, noise on device output signals 52. Accordingly, the control software executed by control unit 28 may provide fan on/off signal 65 (FIG. 1) to fan control circuit 40 (FIG. 1) so as to deactivate, i.e., turn off, fan 38. Deactivation of fan 38 thus removes this source of noise from device output signals 52.

Following task 156, process 142 continues with a task 158. At task 158, device output signals 52 (FIG. 1) are obtained at test unit 30 (FIG. 1) from MEMS devices 22. Device output signals 52 may be stored at test unit 30 for later analysis.

Next, a query task 160 is performed. At query task 160, a determination is made as to whether testing at the current temperature is to be performed with MEMS devices 22 in another position. When testing is to occur in another position, process 160 continues with a task 162.

At task 162, rotational drive system 54 (FIG. 1) is electronically controlled to orient fixture 44 into the next test position. By way of example, the control software executing at control unit 28 can provide X-axis and Y-axis control signals 68, 70 (FIG. 1) to motors 60 and 62 to actuate respective worm drives 106, 120 (FIGS. 6 and 7) in order to electronically control the position of positioning structure 42 and fixture 44. The actual position of fixture 44 may be sensed by position sensor 46 and provided as feedback to control unit 28 and/or rotational drive system 54. For illustrative purposes, during a first iteration of task 162, fixture 44 may be oriented into second position 138 (FIG. 10).

Following task 162, program control loops back to task 158 to again obtain device output signals 52 at task 158, and to make another determination at query task 160 as to whether testing is to occur in another position. Thus, execution of tasks 158, 160, and 162 of temperature test process 142 enable testing of MEMS devices 22 in multiple positions, e.g., first, second, and third positions 132 (FIG. 9), 138 (FIG. 10), 140 (FIG. 11) at a single temperature setting for thermal chamber 24. When a determination is made at query task 160, that there is not another position in which MEMS devices 22 are to be tested, temperature test process 142 continues with a query task 164.

At query task 164, a determination is made as to whether there is another temperature setting for which testing is to occur. When there is another temperature setting, program control loops back to task 148 to again place fixture 44 in an initial position, to set the temperature of thermal chamber 24 at task 150, and to eventually obtain device output signals 52 at task 158 with fixture 44 placed in one or more positions. Thus, execution of query task 164 and loop back to task 148 enables testing of MEMS devices 22 over a range of temperatures, for example in the complete tri-temp range for ambient, hot and cold (−55 C to +180 deg C.). However, when query task 164 determines that there are no further temperature settings for which testing is to occur, temperature test process 142 continues with a task 166.

At task 166, the test results obtained through the execution of temperature test process 142 may be analyzed to determine the functionality of the tested MEMS devices 22. Functionality may entail an automated comparison of device output signals 52 to ensure signal accuracy over a predetermined operational temperature range, to verify trim/calibration parameters for MEMS devices 22, and so forth. Following task 166, temperature test process ends.

It is to be understood that certain ones of the process blocks depicted in FIG. 12 may be performed in parallel with each other or with performing other processes. In addition, it is to be understood that the particular ordering of the process blocks depicted in FIG. 12 may be modified, while achieving substantially the same result. Accordingly, such modifications are intended to be included within the scope of the inventive subject matter. In addition, although particular system configurations are described in conjunction with FIGS. 1-8, above, embodiments may be implemented in systems having other architectures, as well. These and other variations are intended to be included within the scope of the inventive subject matter.

An embodiment of an apparatus includes a support structure, a positioning structure having first and second beams spaced apart from one another, and a third beam interconnected with each of the first and second beams, and a fixture for retaining at least one MEMS device. A first shaft spans between the support structure and the positioning structure. The first shaft is configured to rotate about a first axis relative to the support structure in order to rotate the positioning structure and the fixture about the first axis. A second shaft spans between the first and second beams of the positioning structure, and the fixture is retained on the second shaft. The second shaft is configured to rotate about a second axis relative to the positioning structure in order to rotate the fixture about the second axis, and the second axis is orthogonal to the first axis.

An embodiment of a test system for testing a MEMS device includes a chamber and a support structure, the support structure including a face section, the face section forming a sealable door for the chamber. The test system further includes a positioning structure and a fixture, where the positioning structure has first and second beams spaced apart from one another, and a third beam interconnected with each of the first and second beams, and the fixture is configured to retain the MEMS device. A first shaft spans between the support structure and the positioning structure. The first shaft is configured to rotate about a first axis relative to the support structure in order to rotate the positioning structure and the fixture about the first axis. A second shaft spans between the first and second beams of the positioning structure, and the fixture is retained on the second shaft. The second shaft is configured to rotate about a second axis relative to the positioning structure in order to rotate the fixture about the second axis, the second axis being orthogonal to the first axis. A rotational drive system enables rotation of the positioning structure about the first axis and enables rotation of the fixture about the second axis via electric power, wherein when the sealable door is attached to the chamber, the positioning structure resides inside the chamber, and at least a portion of the rotational drive system resides outside of the chamber.

An embodiment of a method of testing a MEMS device includes loading the MEMS device into a fixture of a positioning apparatus, the positioning apparatus further including a support structure, a positioning structure having first and second beams spaced apart from one another, and a third beam interconnected with each of the first and second beams, a first shaft interconnected with each of the support structure and the positioning structure, and a second shaft interconnected with the first and second beams of the positioning structure, the fixture being retained on the second shaft. The method further includes installing the positioning apparatus into a test chamber, placing the fixture into a first position, and obtaining a first output signal from the MEMS device in the first position. The fixture is oriented into a second position, wherein the first shaft is configured to rotate about a first axis relative to the support structure in order to rotate the positioning structure and the fixture about the first axis, the second shaft is configured to rotate about a second axis relative to the positioning structure in order to rotate the fixture about the second axis, the second axis being orthogonal to the first axis, and the orienting operation includes rotating at least one of the positioning structure and the fixture about at least one of the first and second axes. A second output signal is obtained from the MEMS device in the second position and a functionality of the MEMS device is determined utilizing the first and second output signals.

In summary, the various embodiments enable MEMS devices to be tested in various positions and over a range of temperatures. The test system includes multiple axis control that minimizes operator involvement in a test process, such as thermal conditioning and/or calibration, while achieving improvements in position accuracy, MEMS device throughput, and reduced test time. Accordingly, MEMS devices can be trimmed and qualification readouts can be performed at significant cost savings.

While the principles of the inventive subject matter have been described above in connection with specific apparatus and methods, it is to be clearly understood that this description is made only by way of example and not as a limitation on the scope of the inventive subject matter. The various functions or processing blocks discussed herein and illustrated in the Figures may be implemented in hardware, firmware, software or any combination thereof. Further, the phraseology or terminology employed herein is for the purpose of description and not of limitation.

The foregoing description of specific embodiments reveals the general nature of the inventive subject matter sufficiently so that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A method of testing a microelectromechanical systems (MEMS) device comprising:
    loading said MEMS device into a fixture of a positioning apparatus, said positioning apparatus including a support structure, a positioning structure, a first shaft spanning between said support structure and said positioning structure, and a second shaft in physical communication with said positioning structure, said fixture being retained on said second shaft;
    installing said positioning structure and said fixture into a test chamber;
    placing said fixture into a first position;
    obtaining a first output signal from said MEMS device in said first position;
    orienting said fixture into a second position by rotating at least one of said first and second shafts, wherein said orienting operation rotates said fixture about at least one of first and second orthogonal axes;
    obtaining a second output signal from said MEMS device in said second position; and
    determining a functionality of said MEMS device utilizing said first and second output signals.

2. The method of claim 1 wherein said positioning structure includes first and second beams spaced apart from one another, and a third beam spanning between and interconnected with each of said first and second beams, and said second shaft spans between said first and second beams of said positioning structure.

3. The method of claim 1 wherein said first shaft is configured to rotate about said first axis relative to said support structure in order to rotate said fixture about said first axis, said second shaft is configured to rotate about said second axis relative to said positioning structure in order to rotate said fixture about said second axis.

4. The method of claim 1 wherein said installing comprises engaging a face section of said positioning apparatus with said test chamber to seal said test chamber with said positioning structure and said fixture located within said test chamber, and said orienting operation occurs without unsealing said test chamber.

5. The method of claim 1 wherein said orienting operation comprises electronically controlling a rotational drive system to orient said fixture in said second position.

6. The method of claim 5 further comprising:
    sensing an actual position of said fixture via a position sensor coupled to said fixture; and
    providing, from said position sensor, a feedback control signal of said actual position to said rotational drive system.

7. The method of claim 1 further comprising setting a temperature of said test chamber to a test temperature in accordance with a test protocol, and obtaining said first output signal after said temperature of said test chamber has reached said test temperature.

8. The method of claim 7 further comprising:
    activating a fan within said test chamber in conjunction with said setting operation; and
    deactivating said fan prior to said performing operation.

9. The method of claim 7 further comprising obtaining said second output signal after said temperature of said test chamber has reached said test temperature.

10. The method of claim 7 wherein said test temperature is a first test temperature, and said method further comprises:
    setting said temperature of said test chamber to a second test temperature in accordance with said test protocol;
    replacing said fixture into said first position;
    obtaining a third output signal from said MEMS device in said first position after said temperature of said test chamber has reached said second test temperature;
    reorienting said fixture into said second position; and
    obtaining a fourth output signal from said MEMS device in said second position after said temperature of said test chamber has reached said second test temperature, wherein said determining operation comprises utilizing said first, second, third, and fourth output signals from said MEMS device to determine said functionality of said MEMS device.

11. The method of claim 7 further comprising performing said replacing and reorienting operations by electronically controlling a rotational drive system that is in communication with each of said first and second shafts.

12. A method as claimed in claim 1 further comprising:
    orienting said fixture into a third position; and
    obtaining a third output signal from said MEMS device in said third position, wherein said determining operation determines said functionality of said MEMS device utilizing said first, second, and third output signals.

13. A method of testing a microelectromechanical systems (MEMS) device comprising:
loading said MEMS device into a fixture of a positioning apparatus, said positioning apparatus including a support structure, a positioning structure having first and second beams spaced apart from one another, and a third beam spanning between and interconnected with each of said first and second beams, a first shaft spanning between said support structure and said positioning structure, and a second shaft spanning between said first and second beams of said positioning structure, said fixture being retained on said second shaft;
installing said positioning apparatus into a test chamber;
placing said fixture into a first position;
obtaining a first output signal from said MEMS device in said first position;
orienting said fixture into a second position, wherein said first shaft is configured to rotate about a first axis relative to said support structure in order to rotate said positioning structure and said fixture about said first axis, said second shaft is configured to rotate about a second axis relative to said positioning structure in order to rotate said fixture about said second axis, said second axis being orthogonal to said first axis, and said orienting operation includes rotating at least one of said positioning structure and said fixture about at least one of said first and second axes;
obtaining a second output signal from said MEMS device in said second position; and
determining a functionality of said MEMS device utilizing said first and second output signals.

14. A method as claimed in claim 13 wherein said orienting operation comprises electronically controlling a rotational drive system to orient said fixture in said second position.

15. A method as claimed in claim 13 further comprising:
orienting said fixture into a third position; and
obtaining a third output signal from said MEMS device in said third position, wherein said determining operation determines said functionality of said MEMS device utilizing said first, second, and third output signals.

16. A method of testing a microelectromechanical systems (MEMS) device comprising:
loading said MEMS device into a fixture of a positioning apparatus, said positioning apparatus including a support structure, a positioning structure, a first shaft spanning between said support structure and said positioning structure, and a second shaft in physical communication with said positioning structure, said fixture being retained on said second shaft;
installing said positioning structure and said fixture into a test chamber, said installing operation comprising engaging a face section of said positioning apparatus with said test chamber to seal said test chamber with said positioning structure and said fixture located within said test chamber;
placing said fixture into a first position;
obtaining a first output signal from said MEMS device in said first position;
orienting said fixture into a second position by rotating at least one of said first and second shafts, wherein said orienting operation rotates said fixture about at least one of first and second orthogonal axes, said orienting operation comprises electronically controlling a rotational drive system to orient said fixture in said second position, and said orienting operation occurs without unsealing said test chamber;
obtaining a second output signal from said MEMS device in said second position; and
determining a functionality of said MEMS device utilizing said first and second output signals.

17. The method of claim 16 further comprising:
sensing an actual position of said fixture via a position sensor coupled to said fixture; and
providing, from said position sensor, a feedback control signal of said actual position to said rotational drive system.

18. The method of claim 16 further comprising setting a temperature of said test chamber to a test temperature in accordance with a test protocol, and obtaining said first output signal after said temperature of said test chamber has reached said test temperature.

19. The method of claim 18 further comprising obtaining said second output signal after said temperature of said test chamber has reached said test temperature.

20. The method of claim 18 wherein said test temperature is a first test temperature, and said method further comprises:
setting said temperature of said test chamber to a second test temperature in accordance with said test protocol;
replacing said fixture into said first position;
obtaining a third output signal from said MEMS device in said first position after said temperature of said test chamber has reached said second test temperature;
reorienting said fixture into said second position; and
obtaining a fourth output signal from said MEMS device in said second position after said temperature of said test chamber has reached said second test temperature, wherein said determining operation comprises utilizing said first, second, third, and fourth output signals from said MEMS device to determine said functionality of said MEMS device.

* * * * *